(12) United States Patent
Shin et al.

(10) Patent No.: US 9,834,686 B2
(45) Date of Patent: Dec. 5, 2017

(54) INTEGRATED SILICONE FOR PROTECTING ELECTRONIC DEVICES, CIRCUIT MODULE USING THE SAME AND MANUFACTURING METHOD OF CIRCUIT MODULE

(71) Applicant: SAMSUNG SDI CO., LTD., Yongin-si, Gyeonggi-do (KR)

(72) Inventors: Kyungjae Shin, Yongin-si (KR); Kiwoong Kim, Yongin-si (KR)

(73) Assignee: SAMSUNG SDI CO., LTD., Yonign-Si, Gyeonggi-Do (KR)

( * ) Notice: Subject to any disclaimer, the term of this patent is extended or adjusted under 35 U.S.C. 154(b) by 96 days.

(21) Appl. No.: 14/537,250

(22) Filed: Nov. 10, 2014

(65) Prior Publication Data

US 2015/0138740 A1 May 21, 2015

(30) Foreign Application Priority Data

Nov. 20, 2013 (KR) .................. 10-2013-0141785

(51) Int. Cl.
| | | |
|---|---|---|
| H05K 7/00 | (2006.01) |
| C09D 5/00 | (2006.01) |
| H05K 1/18 | (2006.01) |
| H05K 1/02 | (2006.01) |
| H05K 3/00 | (2006.01) |

(Continued)

(52) U.S. Cl.
CPC ............. *C09D 5/00* (2013.01); *C08J 3/243* (2013.01); *C08K 5/0025* (2013.01); *C08L 83/04* (2013.01); *H01L 23/296* (2013.01); *H05K 1/0259* (2013.01); *H05K 1/18* (2013.01); *H05K 3/0011* (2013.01); *C08K 2003/222* (2013.01); *C08K 2003/2227* (2013.01); *C08K 2003/2231* (2013.01); *C08K 2003/2296* (2013.01); *C08K 2003/282* (2013.01); *C08K 2003/385* (2013.01); *H05K 2201/10015* (2013.01);

(Continued)

(58) Field of Classification Search
CPC .............. C08J 3/243; C08K 2003/222; C08K 2003/2227; C08K 2003/2231; C08K 2003/2296; C08K 2003/282; C08K 2003/385; C08K 5/0025; C08L 83/04; C09D 4/00; C09D 5/00; H05K 1/0259; H05K 1/18; H05K 2201/10
See application file for complete search history.

(56) References Cited

U.S. PATENT DOCUMENTS 5,557,142 A * 9/1996 Gilmore ................ H01L 23/552
174/521
6,099,783 A * 8/2000 Scranton ............. B29C 35/0888
264/272.11

(Continued)

FOREIGN PATENT DOCUMENTS

| JP | 2004-012810 | 1/2004 |
| JP | 2004-022524 A | 1/2004 |

(Continued)

OTHER PUBLICATIONS

Baikerikar et al., Photopolymerizabel liquid encapsulants for microelectronic devices, Polymer 42, 2001 431-441.

*Primary Examiner* — Yuriy Semenenko
(74) *Attorney, Agent, or Firm* — Lee & Morse, P.C.

(57) ABSTRACT

An integrated silicone for protecting electronic devices includes a base resin, a thermal initiator, and a photoinitiator.

15 Claims, 4 Drawing Sheets

(51) Int. Cl.
    *C08L 83/04*         (2006.01)
    *C08J 3/24*          (2006.01)
    *C08K 5/00*         (2006.01)
    *H01L 23/29*        (2006.01)
    C08K 3/22         (2006.01)
    C08K 3/28         (2006.01)
    C08K 3/38         (2006.01)

(52) U.S. Cl.
    CPC ............. *H05K 2201/10022* (2013.01); *H05K 2201/10166* (2013.01); *H05K 2201/10181* (2013.01)

(56) References Cited

U.S. PATENT DOCUMENTS

| | | | |
|---|---|---|---|
| 2004/0179347 A1* | 9/2004 | Miyagawa | H05K 1/0218 |
| | | | 361/818 |
| 2006/0113537 A1* | 6/2006 | Krulevitch | B81C 1/0023 |
| | | | 257/57 |
| 2009/0104386 A1* | 4/2009 | Barrera | B82Y 30/00 |
| | | | 428/34.1 |
| 2010/0003431 A1* | 1/2010 | Raybuck | B32B 1/02 |
| | | | 428/34.2 |
| 2012/0135251 A1* | 5/2012 | Jeong | C08G 73/1025 |
| | | | 428/448 |

FOREIGN PATENT DOCUMENTS

| | | |
|---|---|---|
| JP | 2004-247159 A | 9/2004 |
| KR | 10-2005-0115218 A | 12/2005 |
| WO | WO-2012/067153 A1 | 5/2012 |

* cited by examiner

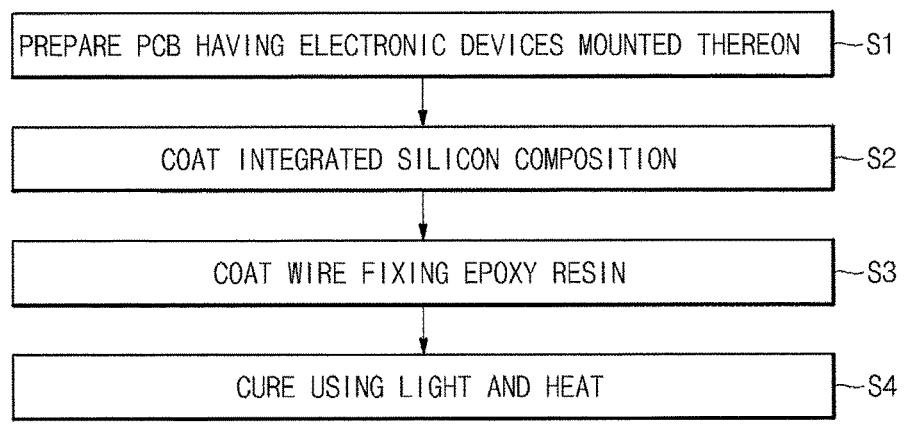
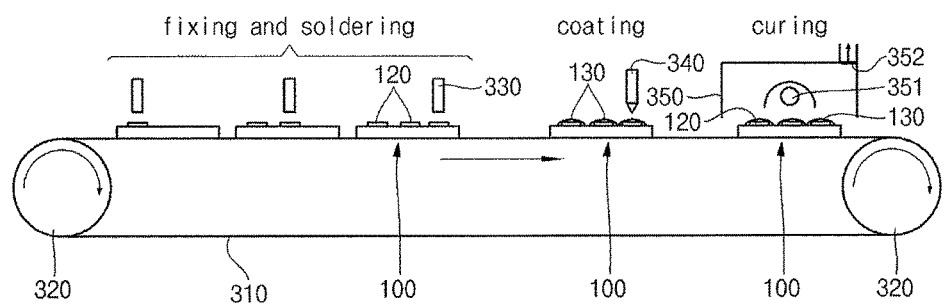

INTEGRATED SILICONE FOR PROTECTING ELECTRONIC DEVICES, CIRCUIT MODULE USING THE SAME AND MANUFACTURING METHOD OF CIRCUIT MODULE

CROSS-REFERENCE TO RELATED APPLICATION

Korean Patent Application No. 10-2013-0141785, filed on Nov. 20, 2013, in the Korean Intellectual Property Office, and entitled: "Integrated Silicone For Protecting Electronic Devices, Circuit Module Using The Same And Manufacturing Method Of Circuit Module," is incorporated by reference herein in its entirety.

BACKGROUND

1. Field

Embodiments relate to integrated silicone for protecting electronic devices, a circuit module using the same, and a manufacturing method of the circuit module.

2. Description of the Related Art

Silicone is used in almost every industrial field, covering general purposes and special purposes. In general, silicone is excellent in heat resistance and chemical resistance and has sealing, adhesiveness, connecting, and foam controlling properties.

SUMMARY

Embodiments are directed to an integrated silicone for protecting electronic devices including a base resin, a thermal initiator, and a photoinitiator.

The integrated silicone may further include an electrostatic discharge (ESD) protecting filler.

The integrated silicone may further include a thermally conductive filler.

The base resin may be contained in an amount of about 62 to about 75 wt %, based on a total weight of the integrated silicone.

The base resin may include at least one selected from the group of polyurethane acrylate, isobornyl acrylate, modified acrylamide and hydroxy ethyl methacrylate.

The thermal initiator may include a silane coupling agent.

The thermal initiator may be contained in an amount of about 4 to about 5 wt %.

The photoinitiator may be contained in an amount of about 8 to about 10 wt %.

The ESD protecting filler may include at least one selected from the group of aluminum oxide ($Al_2O_3$), aluminum hydroxide (AlO), tin dioxide ($SnO_2$), and zinc oxide (ZnO).

The thermally conductive filler may include at least one selected from the group of fumed silica, magnesium oxide (MgO), boron nitride (BN), and aluminum nitride (AlN).

The integrated silicone may further include an ESD protecting filler and a thermally conductive filler. The ESD protecting filler and the thermally conductive filler may be present in an amount of about 22 to about 32 wt %.

Embodiments are also directed to a circuit module including a printed circuit board having a plurality of circuit patterns formed on an insulating layer, a plurality of electronic devices electrically connected to the circuit patterns by solders, and the integrated silicone as claimed in claim 1, the integrated silicone being coated on at least one of the circuit patterns, the solders, and the electronic devices.

The circuit module may further include one or more wires electrically connected to the circuit patterns, and a wire fixing epoxy resin coated on connection regions between the circuit patterns and the wires.

At least one battery cell, at least one temperature sensor, or at least one connector may be electrically connected to the wires.

The electronic devices may include at least one selected from the group of an integrated circuit semiconductor package, a transistor, a resistor, a capacitor, a positive temperature coefficient (PTC) element, and a fuse.

Embodiments are also directed to a manufacturing method of the circuit module including providing a printed circuit board having a plurality of circuit patterns formed on an insulating layer and electrically connecting a plurality of electronic devices to the circuit patterns by solders, coating the integrated silicone as claimed in claim 1 on at least one of the circuit patterns, the solders and the electronic devices, and curing the integrated silicone using light and heat.

The curing using light and heat may include controlling a wavelength of light to be between about 300 nm and about 500 nm and controlling a temperature of the heat to be between about 60° C. and about 100° C.

The curing using light and heat may be performed for about 10 to about 60 seconds.

In the electrically connecting of the plurality of electronic devices to the circuit patterns, the electronic devices include at least one selected from the group of an integrated circuit semiconductor package, a transistor, a resistor, a capacitor, a positive temperature coefficient (PTC) element, and a fuse.

Electrically connecting the plurality of electronic devices to the circuit patterns further includes electrically connecting one or more wires to the circuit patterns. The manufacturing method further includes coating a wire fixing epoxy resin on connection regions between the circuit patterns and the wires, before the curing using light and heat.

BRIEF DESCRIPTION OF THE DRAWINGS

Features will become apparent to those of skill in the art by describing in detail exemplary embodiments with reference to the attached drawings in which:

FIG. 3 illustrates a flowchart depicting a manufacturing method of a circuit module using integrated silicone for protecting electronic devices according to an embodiment; and FIG. 4 illustrates the manufacturing method of a circuit module using integrated silicone for protecting electronic devices according to an embodiment.

DETAILED DESCRIPTION

Figure 1A:
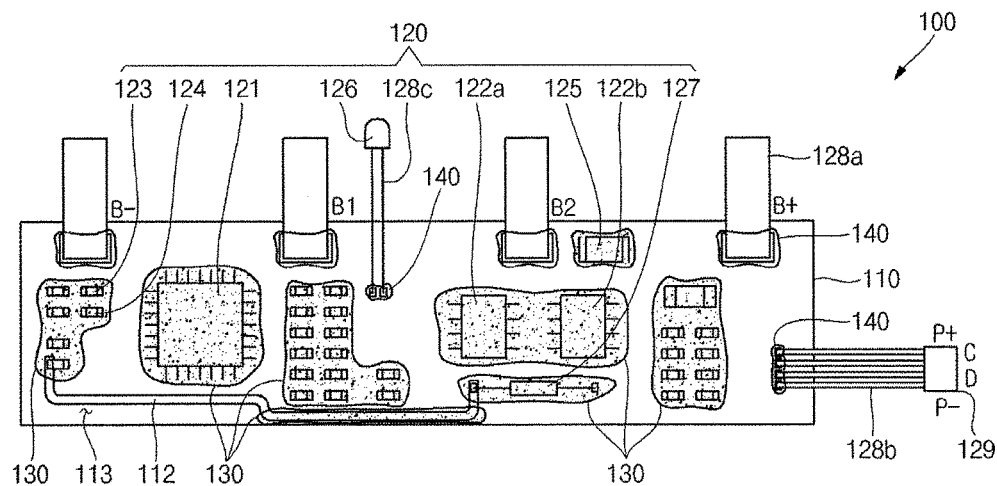
FIGS. 1A, 1B, and 1C illustrate a plan view, a bottom view and a partially cross-sectional view depicting an exemplary circuit module having an integrated silicone for protecting electronic devices according to an embodiment, coated thereon and cured.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In addition, as used herein, the term "electronic device" may refer to general active and passive devices, a circuit pattern, a solder, a wire, and so on. Further, as used herein, the term "circuit module" may include, for example, a protection circuit module electrically connected to a battery cell, and other circuit modules used applied in various fields other than the battery field. When a protection circuit module is electrically connected to a battery cell, the resulting structure may be referred to as a battery pack.

The integrated silicone for protecting electronic devices according to an embodiment may include a base resin, a thermal initiator, and a photoinitiator. In addition, the integrated silicone for protecting electronic devices according to an embodiment may include an electrostatic discharge (ESD) protecting filler and/or a thermally conductive filler.

The base resin may include at least one selected from the group of polyurethane acrylate, isobornyl acrylate, modified acrylamide, hydroxy ethyl methacrylate, and equivalents thereof, as examples. The base resin may have a conformal coating function, a damp-proofing function, and a vibration-absorbing function.

In addition, the base resin may be contained in an amount of about 62 to about 75 wt %, preferably about 63 to about 68 wt % based on a total weight (i.e., 100 wt %) of the integrated silicone. If the amount of the base resin is smaller than 62 wt %, the integrated silicone may have a relatively high viscosity, and the integrated silicone may not be properly coated. If the amount of the base resin is greater than 75 wt %, the integrated silicone may have a relatively low viscosity, and the integrated silicone may be overly flowable so as to be coated even on unwanted regions. When the base resin is contained in an amount with the range of about 62 to about 75 wt %, workability of the integrated silicone may be sufficient. In one embodiment, the present invention includes the base resin that contains the polyurethane acrylate in an amount of about 33 to about 38 wt %, the isobornyl acrylate in an amount of about 20 to about 24 wt %, and the modified acrylamide in an amount of about 9 to about 13 wt %.

The thermal initiator may include, for example, at least one selected from the group of a silane coupling agent and an equivalent thereof.

The thermal initiator may be contained in an amount of about 4 to about 5 wt %, preferably about 4.5 to about 5 wt %, based on a total weight (i.e., 100 wt %) of the integrated silicone. If the amount of the thermal initiator is smaller than about 4 wt %, a thermal curing time of the integrated silicone may be relatively long. If the amount of the thermal initiator is greater than 5 wt %, an unnecessarily large amount of the thermal initiator may be used, in view of the thermal curing time of the integrated silicone.

The photoinitiator may be contained in an amount of about 8 to about 10 wt %, preferably about 9 to about 10 wt %, based on a total weight (i.e., 100 wt %) of the integrated silicone. If the amount of the photoinitiator is smaller than 8 wt %, a photo-curing time of the integrated silicone may be relatively long. If the amount of the photoinitiator is greater than 10 wt %, an unnecessarily large amount of the photoinitiator may be used, in view of the photo-curing time of the integrated silicone.

The ESD protecting filler may include at least one selected from the group of aluminum oxide ($Al_2O_3$), aluminum hydroxide (AlO), tin dioxide ($SnO_2$), zinc oxide (ZnO) and equivalents thereof. In some cases, the thermally conductive filler to be described below may also have an ESD protecting function.

The thermally conductive filler may include, for example, at least one selected from the group of fumed silica, magnesium oxide (MgO), boron nitride (BN), aluminum nitride (AlN), and equivalents thereof. In some cases, the above-described ESD protecting filler may also have a thermal conducting function.

The ESD protecting filler and the thermally conductive filler may be contained in an amount of about 22 to about 32 wt %, preferably about 22 to about 23 wt %, or preferably about 26 to about 32 wt %, based on a total weight (i.e., 100 wt %) of the integrated silicone. If the amounts of the ESD protecting filler and the thermally conductive filler are smaller than 22 wt %, the integrated silicone may have a relatively low viscosity, and the integrated silicone may be overly flowable to be coated even on unwanted regions. If the amounts of the ESD protecting filler and the thermally conductive filler are greater than 32 wt %, the integrated silicone may have relatively high viscosity, and the integrated silicone may not be properly coated. When the ESD protecting filler and the thermally conductive filler are contained in an amount out of the range between about 22 and about 32 wt %, workability of the integrated silicone may be lowered. In one embodiment, the present invention includes the ESD protecting filler and the thermally conductive filler that contains the aluminum oxide ($Al_2O_3$) in an amount of about 10 to 12 wt %, the aluminum hydroxide (AlO) in an amount of about 15 to about 17 wt %, and the fumed silica in an amount of about 1 to about 3 wt %.

Here, the integrated silicone 130 according to the present invention for obtaining experimental results of tables 1 to 6 to be described below includes the polyurethane acrylate in an amount of about 33 to about 38 wt %, the isobornyl acrylate in an amount of about 20 to about 24 wt %, the modified acrylamide in an amount of about 9 to about 13 wt %, the silane coupling agent in an amount of about 4 to about 5 wt %, the photoinitiator in an amount of about 8 to about 10 wt %, the aluminum oxide ($Al_2O_3$) in an amount of about 10 to 12 wt %, the aluminum hydroxide (AlO) in an amount of about 15 to about 17 wt %, and the fumed silica in an amount of about 1 to about 3 wt %.

Figure 1B:
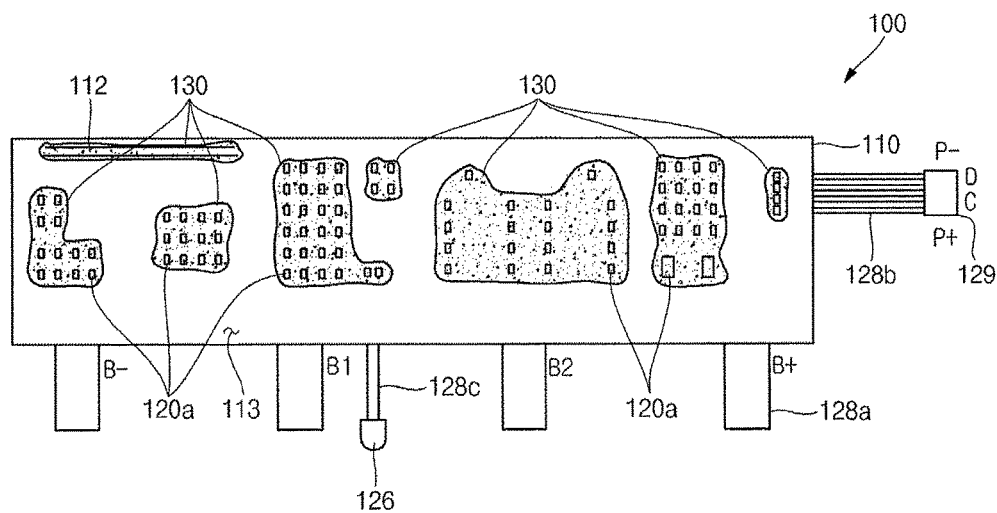
Figure 1C:
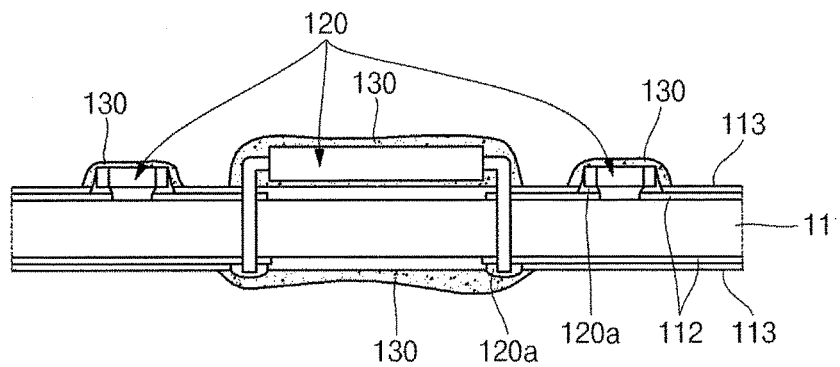

Referring to FIGS. 1A, 1B, and 1C, an exemplary circuit module 100 having integrated silicone 130 for protecting electronic devices according to an embodiment, coated thereon and cured, is illustrated as a plan view, a bottom view, and a partially cross-sectional view, respectively.

As illustrated in FIGS. 1A to 1C, the circuit module 100 according to an embodiment may include a printed circuit board 110, a plurality of electronic devices 120, and integrated silicone 130 coated on the circuit module 100 and cured.

The printed circuit board 110 may include a plurality of circuit patterns 112 formed thereon about an insulating layer 111. Most of the circuit patterns 112 may be covered by a protection layer 113, such as a solder mask. The printed circuit board 110 may include at least one of a rigid circuit board, a flexible circuit board, and equivalents thereof.

The plurality of electronic devices 120 may be electrically connected to the circuit patterns 112 provided in the printed circuit board 110 by solders 120a. For example, the electronic devices 120 include an integrated circuit (IC) semiconductor package 121, transistors 122a and 122b, a resistor 123, a capacitor 124, a positive temperature coefficient (PTC) element 125, a temperature sensor 126, and/or a fuse 127. The IC semiconductor package 121 may be a microprocessor unit, and the transistors 122a and 122b may be a charge control switch and a discharge control switch, respectively.

In addition, one or more wires 128a, 128b, and 128c may be electrically connected to the circuit patterns 112 provided in the printed circuit board 110 by the solders 120a. In an exemplary embodiment, the wire 128a may include a lead plate electrically connecting the circuit module 100 and a battery cell 210. In addition, the wire 128b may be connected to a connector 129 electrically connecting a battery pack 200 and an external set. Further, the wire 128c may be connected to the temperature sensor 126 for sensing a temperature of the battery cell 210.

Here, the circuit module 100 is provided by way of example only for a better understanding thereof.

The integrated silicone 130 may be coated on at least one of the circuit patterns 112, the solders 120a, and the electronic devices 120 to then be cured. The integrated silicone 130 may have conformally coating, damp-proofing, vibration-absorbing, thermally conducting, and ESD protecting functions. The integrated silicone 130 may protect the circuit patterns 112, the solders 120a, and/or the electronic devices 120 from external physical, chemical environments.

The integrated silicone 130 may prevent moisture from penetrating into the electronic devices 120. In addition, the integrated silicone 130 may prevent vibrations from being transferred to the electronic devices 120. Further, the integrated silicone 130 may allow the heat generated from the electronic devices 120 (e.g., the IC semiconductor package 121 and the transistors 122a and 122b) to be rapidly exhausted to the outside. In addition, the integrated silicone 130 may allow temperatures of the battery cell 210 or surrounding portions thereof to be rapidly transferred to the electronic devices 120 (e.g., the PTC 125). For example, the integrated silicone 130 may prevent static electricity from being introduced into the circuit patterns 112, the solders 120a, and the electronic devices 120. The integrated silicone 130 may be white due to the filler contained therein, as an example. The integrated silicone 130 may include the base resin, the thermal initiator, the photoinitiator, the ESD protecting filler, and/or the thermally conductive filler.

In addition, a wire fixing epoxy resin 140 may be coated on connection regions (e.g., the solders 120a) between the circuit patterns 112 and the wires 128a, 128b, and 128c. The wire fixing epoxy resin 140 may be transparent so that its internal state can be observed. The wire fixing epoxy resin 140 may be a general epoxy resin for fixing an electronic part. The wire fixing epoxy resin 140 may have high adhesiveness, excellent workability, and a quickly curing property.

Figure 2:
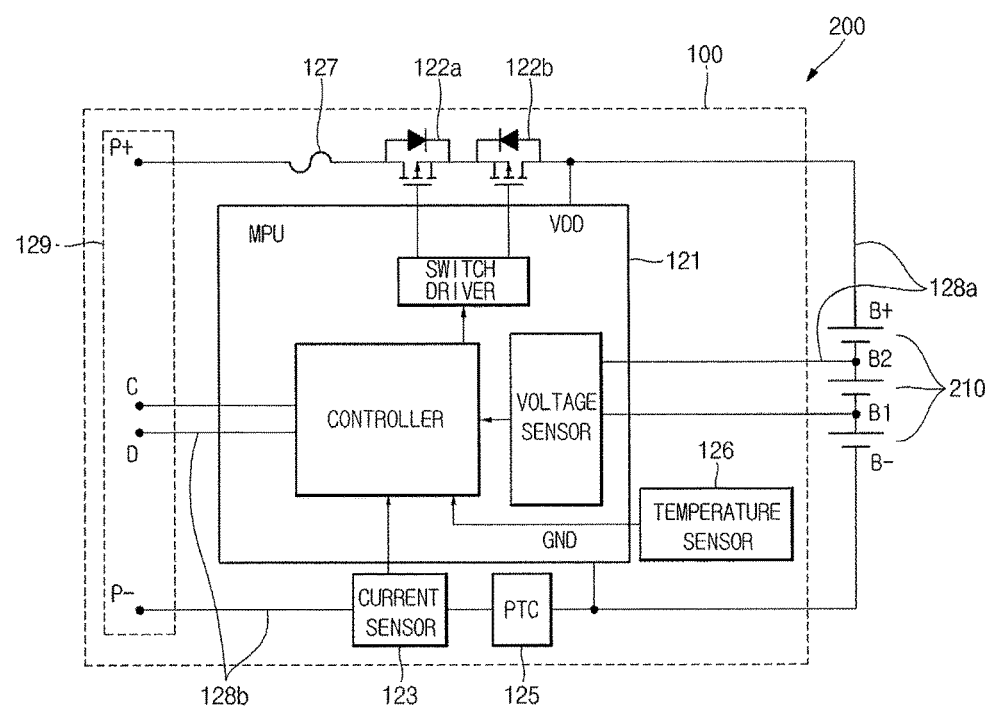
FIG. 2 illustrates an exemplary circuit view depicting a state in which the circuit module having integrated silicone for protecting electronic devices according to an embodiment coated thereon and cured is electrically connected to a battery cell.

Referring to FIG. 2, a circuit view illustrates a state in which the circuit module having an integrated silicone for protecting electronic devices coated thereon and cured is electrically connected to the battery cell 210, according to an embodiment.

As described above, the battery pack 200 may include at least one battery cell 210 and a protection circuit module for preventing the battery cell 210 from being overcharged or overdischarged. The protection circuit module may be the above-described circuit module 100.

As illustrated in FIG. 2, the circuit module 100 may be electrically connected to the battery cell 210 through the wire 128a (or a lead plate or a flexible circuit board). In addition, the circuit module 100 may be electrically connected to the connector 129 through the wire 128b, and the connector 129 may be connected to an external set or a charger. The connector 129 may be directly mounted on the printed circuit board 110 without using a wire. The circuit module 100 may include the IC semiconductor package 121, the transistors 122a and 122b, the current sensor (e.g., the resistor 123), the PTC 125, the temperature sensor 126, and the fuse 127. The circuit module 100 shown in FIG. 2 is provided by way of example for a better understanding of embodiments.

The battery cell 210 may be a general prismatic battery, a cylindrical battery, or a pouch type battery, as examples.

Referring to FIGS. 3 and 4, the manufacturing method of the circuit module 100 using the integrated silicone 130 for protecting electronic devices according to an embodiment is illustrated. FIGS. 1A to 1C are also referred to in describing the manufacturing method of the circuit module 100 using the integrated silicone 130 for protecting electronic devices according to an embodiment.

The manufacturing method of the circuit module 100 according to an embodiment may include: (S1) providing a printed circuit board, (S2) coating an integrated silicone composition onto the printed circuit board, and (S4) curing the integrated silicone composition using light and heat. In addition, the manufacturing method of the circuit module 100 according to an embodiment may include (S3) coating a wire fixing epoxy resin.

In providing a printed circuit board (S1), the printed circuit board 110 having the plurality of circuit patterns 112 on the insulating layer 111 and the plurality of electronic devices 120 may be electrically connected to the circuit patterns 112 by the solders 120a. The electronic devices 120 may include the IC semiconductor package 121, the transistors 122a and 122b, the resistor 123, the PTC 125, the temperature sensor 126, and the fuse 127. The wires 128a, 128b, and 128c may be electrically connected to the printed circuit board 110 by the solders 120a.

In coating the integrated silicone (S2), the integrated silicone 130 may be coated on the circuit patterns 112, the solders 120a, and/or the electronic devices 120. As described above, the integrated silicone 130 may have conformally coating, damp-proofing, vibration absorbing, thermally conducting, and ESD protecting functions. Unlike in manufacturing method according to comparative examples, in which multiple process steps of coating conformally coating silicone, damp-proofing silicone, vibration-absorbing silicone, thermally conducting silicone, and ESD protecting silicone, are performed in sequence, in the method according to present embodiments, coating of the integrated silicone may be completed just by a single coating step of the integrated silicone.

In addition, a wire fixing epoxy resin 140 may be coated on connection regions between the circuit patterns 112 and the wires 128a, 128b, and 128c (S3). The wire fixing epoxy resin 140 may be a general UV curable resin.

In the curing using light and heat (S4), the integrated silicone 130 may be cured using light (e.g., UV light) and heat. The wire fixing epoxy resin 140 may also be photocured.

A wavelength of the light may be controlled to be between about 300 nm and about 500 nm and a temperature of the applied heat may be controlled to be between about 60° C. and about 100° C. In addition, the curing using light and heat (S4) may be performed for about 10 to about 60 seconds. If the wavelength of the light is smaller than 300 nm or greater than 500 nm, photo-curing may not be properly performed. In addition, if the temperature is lower than 60° C., thermal curing may not be properly performed, and if the temperature is higher than 100° C., the electronic devices 120 may be damaged. Further, if the curing time is shorter than 10 seconds, the curing using light and/or heat may not be properly performed. If the curing time is longer than 60 seconds the curing time may be unnecessarily long.

If the integrated silicone 130 were to be cured using only light, a non-curing phenomenon could occur with respect to shaded regions. However, as described above, the integrated silicone 130 may be cured by the heat generated from a light source 351, thereby shortening the overall curing time and providing excellent curing performance.

All of the process steps may be performed on a conveyor belt 310 that is coupled to a roller 320 and that rotates in one direction. A tool 330 for fixing and soldering the electronic devices 120 and a cylinder 340 for coating the integrated silicone 130 may be positioned on the conveyor belt 310. In addition, a chamber 350 including a light source 351 and an exhaust fan 352 for curing the integrated silicone 130 using light and heat may also be positioned on the conveyor belt 310.

An internal temperature of the chamber 350 where curing using light and curing using heat are performed may be controlled by the exhaust fan 352. The light source 351 may increase the ambient temperature of the chamber 350 to be higher than 100° C., but the exhaust fan 352 may control the internal temperature of the chamber 350 to be between about 60° C. and about 100° C.

Table 1 shows high temperature and high humidity test conditions. It was confirmed that corrosion did not occur with respect to the electronic devices (i.e., the IC semiconductor package, the circuit patterns, the solders, etc. of the circuit module according to embodiments) under the high temperature and high humidity test conditions.

TABLE 1

| | Conditions | | |
|---|---|---|---|
| | Time | Humidity | Temperature |
| Salt water | 2 hr | 5% | 20° C. |
| Product No. 1 | 22 hr | 93% | 40 ± 2° C. |
| Product No. 2 | 54 hr | 85% | 50° C. |

Figure 5A:
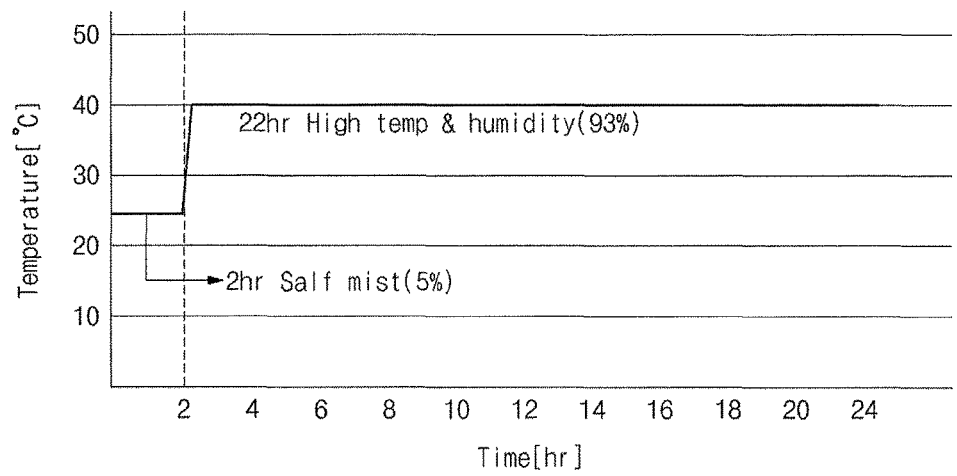
FIGS. 5A and 5B illustrate a high temperature and high humidity test condition of the circuit module using the integrated silicone for protecting electronic devices according to an embodiment.

More specifically, after an injection to the circuit module (product NO. 1) with salt water that has a salinity of 5%, the circuit module (product NO. 1) is allowed to stand for 2 hours at the humidity of 5% and the temperature 20° C. And then, as shown FIG. 5A, the circuit module as in the above (product NO. 1) is allowed to stand for 22 hours at the humidity of 93% and the temperature 40±2° C.

Figure 5B:
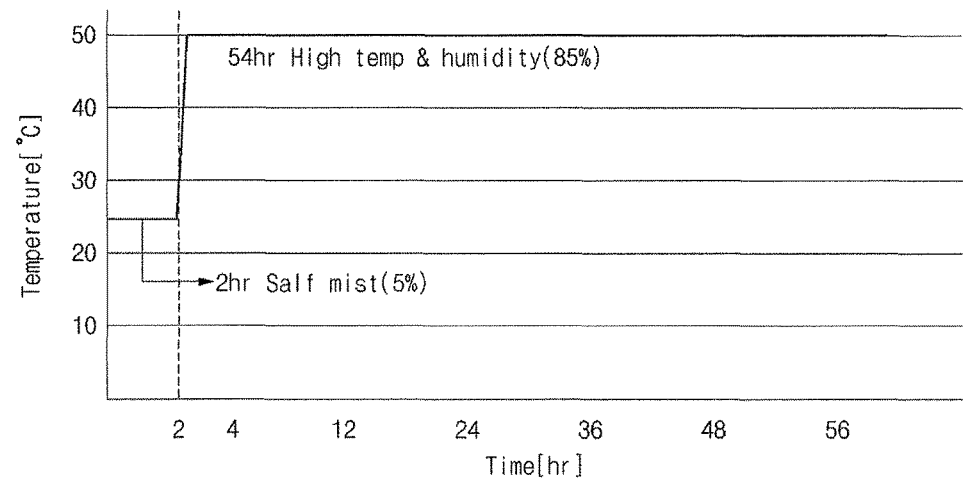

Further, after an injection to the circuit module (product NO. 2) with salt water that has a salinity of 5%, the circuit module (product NO. 2) is allowed to stand for 2 hours at the humidity of 5% and the temperature 20° C. And then, as shown FIG. 5B, the circuit module as in the above (product NO. 2) is allowed to stand for 54 hours at the humidity of 85% and the temperature 50° C.

Table 2 shows ESD test conditions. It was confirmed that the circuit module according to an Example embodiment was not electrically damaged under the ESD test conditions. In Table 2, the term "Comparative Example" refers to a circuit module that undergoes separate, multiple process steps of conformally coating silicone, damp-proofing silicone, vibration-absorbing silicone, thermally conducting silicone and ESD protecting silicone. In addition, the term "contact" indicates that static electricity is applied in a state in which the static electricity was in contact with the electronic device, and the term "air" indicates that static electricity is applied in a state in which the static electricity was spaced apart from the electronic device.

For example, in the Comparative Example, 1-2577LV of the Dow Corning® has been applied to the circuit modules for the conformal coating, ES2031W of Canada Silicone INC. has been applied to the circuit modules for the thermal conductivity coating, and SE9189L of Dow Corning® has been applied to the circuit modules for the antistatic coating.

TABLE 2

| | | −8 kV | −10 kV | −12 kV | −15 kV | −17 kV | −19 kV |
|---|---|---|---|---|---|---|---|
| Comparative Example | Contact | Pass | Pass | Pass | — | — | — |
| | Air | — | — | — | Pass | Pass | Pass |
| Example | Contact | Pass | Pass | Pass | — | — | — |
| | Air | — | — | — | Pass | Pass | Pass |

Table 3 shows detection results of harmful substances from the circuit module, specifically, the integrated silicone. As shown in Table 3, no harmful substance was detected from the integrated silicone according to embodiments. Here, (X-Ray fluorescence spectrometry (XRF) was used in detecting the harmful substances.

TABLE 3

| List | Cd | Pb | Hg | Cr | Sb | Br | Cl |
|---|---|---|---|---|---|---|---|
| Result | Pass | Pass | Pass | Pass | Pass | Pass | Pass |

Table 4 shows tensile strength test results of wires of the circuit module according to embodiments. If a wire has a tensile strength of 1 kgf or greater, the wire is regarded as a normal wire.

TABLE 4

| | Product 1 | Product 2 | Product 3 | Product 4 | Product 5 |
|---|---|---|---|---|---|
| Wire 1 | 2.44 | 2.55 | 2.59 | 2.59 | 2.68 |
| Wire 3 | 5.98 | 6.4 | 5.89 | 6.12 | 5.49 |

Table 5 shows electrical function test results before and after battery packs each including the inventive circuit module were exposed to high temperature and high humidity conditions (50° C., 85% RH, 48 hrs). In an exemplary embodiment, the OCV (open circuit voltage), IR, charge/discharge, communication, external appearance, and leak status of the battery pack were all determined as being normal before and after the battery pack was exposed to the high temperature and high humidity conditions. The OCV refers to a voltage of a battery cell when a current does not flow from the battery cell to the outside of the battery cell, and the IR refers to internal resistance of the battery cell. A ratio of OCV to IR (i.e., OCV/IR) is a factor in determining whether the battery pack is good or bad.

TABLE 5

| | Before testing | | | | | | After testing | | | | | | |
|---|---|---|---|---|---|---|---|---|---|---|---|---|---|
| | | | | | Ext. | | | | | | Ext. | | |
| | Function | | | | | | Function | | | | | | |
| No. | OCV | IR | C/D | Comm. | App. | Leak | OCV | IR | C/D | Comm. | App. | Leak | Result |
| 1 | 11.499 | 173.86 | OK | OK | OK | NO | 11.498 | 177.36 | OK | OK | OK | NO | OK |
| 2 | 11.497 | 169.80 | OK | OK | OK | NO | 11.494 | 170.20 | OK | OK | OK | NO | OK |
| 3 | 11.501 | 172.60 | OK | OK | OK | NO | 11.500 | 172.47 | OK | OK | OK | NO | OK |
| 4 | 11.499 | 171.58 | OK | OK | OK | NO | 11.498 | 169.81 | OK | OK | OK | NO | OK |
| 5 | 11.497 | 169.67 | OK | OK | OK | NO | 11.497 | 169.29 | OK | OK | OK | NO | OK |

(C/D: Charge/Discharge; Comm.: Communication; Ext. App.: External Appearance; Leak: Leakage)

Table 6 shows electrical function test results before and after battery packs each including circuit module according to embodiments were exposed to ESD conditions (Contact: −8 kV; Air: −15 kV). In an exemplary embodiment, the OCV (open circuit voltage), IR, charge/discharge, communication, external appearance, and leak status of the battery pack were all determined as being normal before and after the battery pack was exposed to the ESD conditions.

TABLE 6

| | Before testing | | | | | (+/−8 KV) Contact | | | | | (+/−15 KV)Air | | | | | |
|---|---|---|---|---|---|---|---|---|---|---|---|---|---|---|---|---|
| | | | | | Leak Fire | | | | | Leak Fire | | | | | Leak Fire | |
| | Function | | | | | Function | | | | | Leak | | | | | |
| No. | OCV | IR | C/D | Comm. | leak | OCV | IR | C/D | Comm. | leak | OCV | IR | C/D | Comm. | leak | Result |
| 1 | 11.498 | 170.51 | OK | OK | OK | 11.499 | 171.79 | OK | OK | OK | 11.499 | 168.73 | OK | OK | OK | OK |
| 2 | 11.496 | 169.03 | OK | OK | OK | 11.496 | 167.43 | OK | OK | OK | 11.496 | 168.36 | OK | OK | OK | OK |
| 3 | 11.505 | 167.72 | OK | OK | OK | 11.503 | 166.67 | OK | OK | OK | 11.505 | 167.60 | OK | OK | OK | OK |
| 4 | 11.497 | 173.10 | OK | OK | OK | 11.497 | 171.19 | OK | OK | OK | 11.498 | 170.30 | OK | OK | OK | OK |
| 5 | 11.505 | 172.88 | OK | OK | OK | 11.506 | 170.22 | OK | OK | OK | 11.506 | 168.21 | OK | OK | OK | OK |

(C/D: Charge/Discharge; Comm.: Communication; Ext. App.: External Appearance; Leak: Leakage)

By way of summation and review, according to a comparative embodiment, in order to protect multiple electronic devices mounted on a circuit module, different kinds of silicones are coated on the electronic devices in different process steps, with the result that a coating time may be unduly prolonged. In addition, separate trays and multiple coating apparatuses may be required to transfer the circuit module to various processing stages. For example, according to a comparative example, a silicone for protecting an electronic device may include silicone for conformal coating for protecting the electronic device from external physical, chemical environments, damp-proofing silicone for preventing moisture from penetrating into the electronic device, vibration-absorbing silicone for preventing vibrations from being transferred to the electronic device, thermally conducting silicone for transmitting heat to the electronic device or discharging heat from the electronic device, ESD protecting silicone for protecting the electronic device from ESD, and so on.

Therefore, in order to protect the electronic device according to the conventional example, applying conformally coating silicone, damp-proofing silicone, vibration-absorbing silicone, thermally conducting silicone and ESD protecting silicone, are performed in sequence. Here, the conformally coating silicone, the damp-proofing silicone, the vibration-absorbing silicone, the thermally conducting silicone and the ESD protecting silicone generally have a curing time of approximately 30 minutes, respectively. Accordingly, a long silicone curing time may be required according to the comparative example.

As described above, embodiments provide an integrated silicone for protecting electronic devices that may include an integrated silicone including a base resin, a thermal initiator, and a photoinitiator, and, in some cases, further including an ESD protecting filler and/or a thermally conductive filler. The integrated silicone for protecting electronic devices may have conformal coating, damp-proofing, vibration absorbing, thermal conducting and electrostatic discharge (ESD) protecting functions, and may be cured within 60 seconds. Accordingly, a manufacturing time of a circuit module may be considerably shortened. Embodiments also provide a circuit module using the same, and a manufacturing method of the circuit module.

In addition, the battery pack including the circuit module according to embodiments may provide normal OCV, IR, charge/discharge, communication, external appearance states and may experience no leakage even under the high temperature and high humidity/ESD conditions.

Therefore, the integrated silicone according to embodiments may ensure normal electrical performance even under the high temperature and high humidity/ESD conditions while considerably reducing the manufacturing time of the circuit module (protection circuit module) and the battery pack including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A circuit module, comprising:
   a printed circuit board having a plurality of circuit patterns formed on an insulating layer;
   a plurality of electronic devices electrically connected to the circuit patterns by solders; and
   an integrated silicone being coated on the circuit patterns, the solders, and the electronic devices, wherein the integrated silicone includes:
   a base resin;
   a thermal initiator;
   a thermally conductive filler;
   a photoinitiator; and
   an electrostatic discharge (ESD) protecting filler, the ESD protecting filler including aluminum oxide ($Al_2O_3$), aluminum hydroxide (AlOH), tin oxide ($SnO_2$), or zinc oxide (ZnO),
   wherein the ESD protecting filler and the thermally conductive filler are present in an amount of 22 to 32 wt %.

2. The circuit module as claimed in claim 1, wherein the base resin is contained in an amount of 62 to 75 wt %, based on a total weight of the integrated silicone.

3. The circuit module as claimed in claim 1, wherein the base resin includes at least one selected from the group of polyurethane acrylate, isobornyl acrylate, modified acrylamide, and hydroxy ethyl methacrylate.

4. The circuit module as claimed in claim 1, wherein the thermal initiator includes a silane coupling agent.

5. The circuit module as claimed in claim 1, wherein the thermal initiator is present in an amount of 4 to 5 wt %.

6. The circuit module as claimed in claim 1, wherein the photoinitiator is present in an amount of 8 to 10 wt %.

7. The circuit module as claimed in claim 1, wherein the thermally conductive filler includes at least one selected from the group of fumed silica, magnesium oxide (MgO), boron nitride (BN), and aluminum nitride (AlN).

8. The circuit module as claimed in claim 1, further comprising:
   one or more wires electrically connected to the circuit patterns; and
   a wire fixing epoxy resin coated on connection regions between the circuit patterns and the wires.

9. The circuit module as claimed in claim 8, wherein at least one battery cell, at least one temperature sensor, or at least one connector are electrically connected to the wires.

10. The circuit module as claimed in claim 1, wherein the electronic devices include at least one selected from the group of an integrated circuit semiconductor package, a transistor, a resistor, a capacitor, a positive temperature coefficient (PTC) element, and a fuse.

11. A manufacturing method of a circuit module, the method comprising:
    providing a printed circuit board having a plurality of circuit patterns formed on an insulating layer and electrically connected to a plurality of electronic devices by solders;
    coating the integrated silicone as claimed in claim 1 on at least one of the circuit patterns, the solders and the electronic devices; and
    curing the integrated silicone using light and heat.

12. The manufacturing method as claimed in claim 11, wherein the curing using light and heat includes controlling a wavelength of light to be between 300 nm and 500 nm and controlling a temperature of the heat to be between 60° C. and 100° C.

13. The manufacturing method as claimed in claim 11, wherein the curing using light and heat is performed for 10 to 60 seconds.

14. The manufacturing method as claimed in claim 11, wherein the electronic devices include at least one selected from the group of an integrated circuit semiconductor package, a transistor, a resistor, a capacitor, a positive temperature coefficient (PTC) element, and a fuse.

15. The manufacturing method as claimed in claim 11, wherein:
    one or more wires connect the plurality of electronic devices to the circuit patterns, and
    the manufacturing method further includes coating a wire fixing epoxy resin on connection regions between the circuit patterns and the wires, before the curing using light and heat.

* * * * *